United States Patent [19]

Feinberg

[11] Patent Number: 4,728,893
[45] Date of Patent: Mar. 1, 1988

[54] INCREASED SIGNAL-TO-NOISE RATIO IN MAGNETIC RESONANCE IMAGES USING SYNTHESIZED CONJUGATE SYMMETRIC DATA

[75] Inventor: David A. Feinberg, Berkeley, Calif.

[73] Assignee: The Regents of the University of California, Berkeley, Calif.

[21] Appl. No.: 70,156

[22] Filed: Jul. 2, 1987

Related U.S. Application Data

[63] Continuation of Ser. No. 760,833, Jul. 31, 1985, abandoned.

[51] Int. Cl.⁴ .............................................. G01R 33/20
[52] U.S. Cl. ...................................... 324/312; 324/309
[58] Field of Search ............... 324/300, 307, 308, 309, 324/310, 312, 313, 318; 364/527, 571

[56] References Cited

U.S. PATENT DOCUMENTS 4,649,345 3/1987 Yoda et al. ........................... 324/309
4,661,775 4/1987 Kormos et al. ...................... 324/307

OTHER PUBLICATIONS

Pages 38–41 from a Thesis entitled "Instrumentation for the Measurement of Viscosity and Flow of Biological Fluids", by Lawrence E. Crooks, dated 6-28-78.

Primary Examiner—Michael J. Tokar
Attorney, Agent, or Firm—Nixon & Vanderhye

[57] ABSTRACT

A complete data set of complex-valued NMR signal responses (sufficient to determine an NMR image) is conventionally acquired. Thereafter, using such time domain signals and/or a one-dimensional Fourier transform of same, synthesized NMR signals are derived using assumed complex conjugate symmetry relationships between the desired NMR signal components. Such synthesized data is then averaged (e.g. with the actually acquired data) to result in averaged data having an improved signal-to-noise ratio (e.g. up to 100% improvement or more is theoretically possible). Such improvement is made possible because the noise signal components (unlike the desired signal components) do not actually exhibit complex conjugate symmetry. Accordingly, noise signals add incoherently while desired signals add coherently when the synthesized data is averaged. Once an averaged data set is thus derived having improved signal-to-noise ratio, it may be conventionally transformed to an NMR image (e.g. by two-dimensional Fourier transformation) so as to result in an NMR image having a similarly improved signal-to-noise ratio.

10 Claims, 8 Drawing Figures

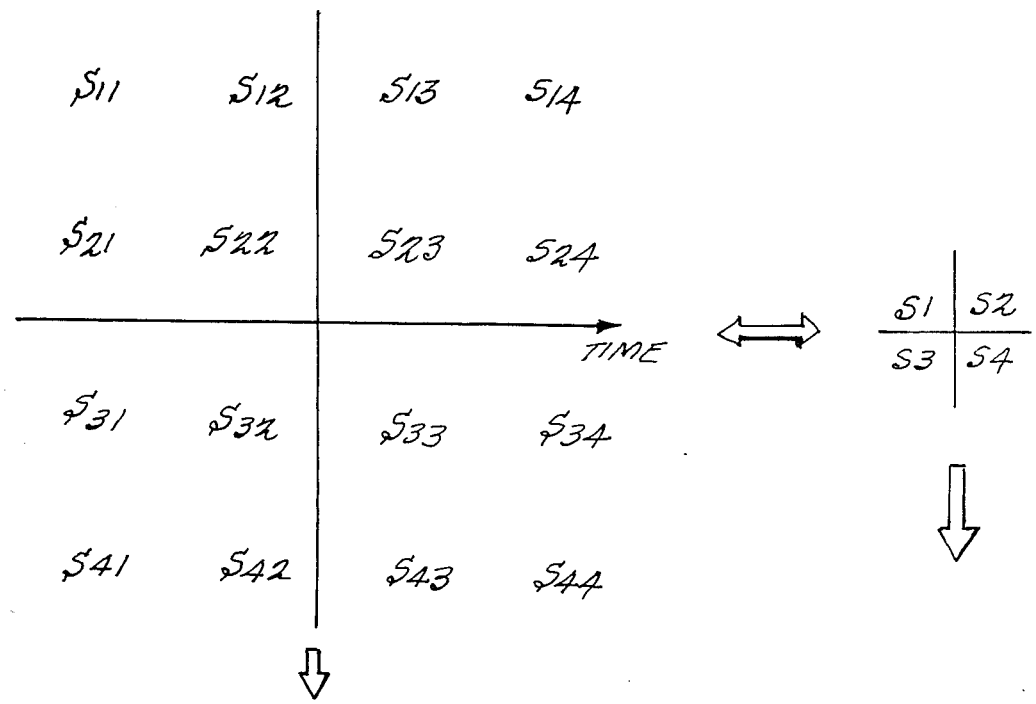
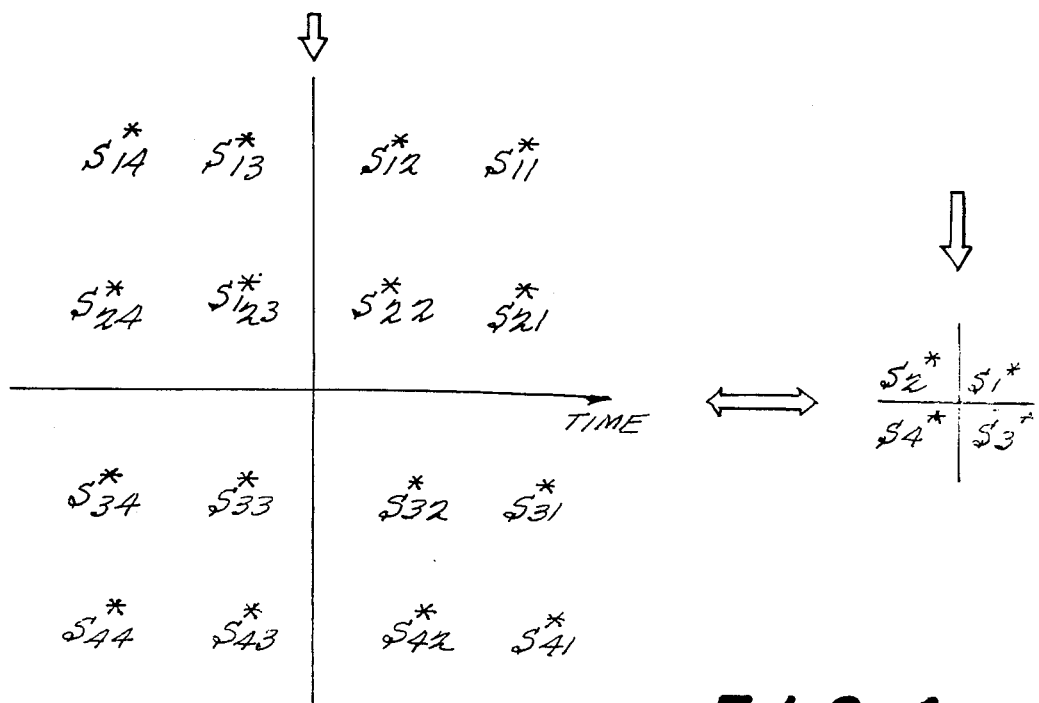
FIG. 4

| $S1(t)$ | $S2(t)$ |
|---|---|
| $N1(t)$ | $N2(t)$ |
| $S3(t)$ | $S4(t)$ |
| $N3(t)$ | $N4(t)$ |

ACTUAL ACQUIRED FULL DATA SET $D1$ $+$

| $S2^*$ | $S1^*$ |
|---|---|
| $N2^*$ | $N1^*$ |
| $S4^*$ | $S3^*$ |
| $N4^*$ | $N3^*$ |

SYNTHETIC DATA SET $D2$ USING COMPLEX CONJUGATE SYMMETRY IN TIME DOMAIN $t$

| $2S1$ | $2S2$ |
|---|---|
| $N1+N2^*$ | $N2+N1^*$ |
| $2S3$ | $2S4$ |
| $N3+N4^*$ | $N4+N3^*$ |

FIG. 5
$D1+D2$
AVERAGED DATA SET

BUT $N1 \neq N2^*$
$N3 \neq N4^*$
THEREFORE

| $2S1$ | $2S2$ |
|---|---|
| $\sqrt{2}N1$ | $\sqrt{2}N2$ |
| $2S1$ | $2S4$ |
| $\sqrt{2}N3$ | $\sqrt{2}N4$ |

S/N IMPROVED $2/\sqrt{2}$

BY DOING 1D FT FOR X-AXIS, WE GET TO
PSEUDO-TIME DIMENSION $t'$:

ACTUAL ACQUIRED
FULL DATA SET D1

| $S1(t)$ | $S2(t)$ |
|---|---|
| $N1(t)$ | $N2(t)$ |
| $S3(t)$ | $S4(t)$ |
| $N3(t)$ | $N4(t)$ |

1D FT OF $S(t)$ ON X DIMENSION
FOR EACH $G_y$ VALUE GIVES $S'(t')$
FOR EACH $G_y$

ACTUAL ACQUIRED
FULL DATA SET D'1
AFTER 1D FT

↑ $t'$

| $S'1(t')$ | $S'2(t')$ |
|---|---|
| $N'1(t')$ | $N'2(t')$ |
| $S'3(t')$ | $S'4(t')$ |
| $N'3(t')$ | $N'4(t')$ |

NOW BECAUSE OF COMPLEX
CONJUGATE SYMMETRY ALONG $t'$,
$S'1 = S'3^*$
$S'2 = S'4^*$
$S'3 = S'1^*$
$S'4 = S'2^*$

THEREFORE
ACTUAL ACQUIRED
DATA SET D'1

| $S'1$ | $S'2$ |
|---|---|
| $N'1$ | $N'2$ |
| $S'3$ | $S'4$ |
| $N'3$ | $N'4$ |

+

SYNTHETIC DATA SET
D'3

| $S'3^*$ | $S'4^*$ |
|---|---|
| $N'3^*$ | $S'4^*$ |
| $S'1^*$ | $S'2^*$ |
| $N'1^*$ | $N'2^*$ |

$\underline{D'1(t') + D'3(t')}$

| $2S'1$ | $2S'2$ |
|---|---|
| $N'1 + N'3^*$ | $N'2 + N'4^*$ |
| $2S'3$ | $2S'4$ |
| $N'3 + N'1^*$ | $N'4 + N'2^*$ |

BUT $N'1 \neq N'3^*$
$N'2 \neq N'4^*$

THEREFORE
⇩

$\underline{D'1(t') + D'3(t')}$

| $2S'1$ | $2S'2$ |
|---|---|
| $\sqrt{2}N'1$ | $\sqrt{2}N'2$ |
| $2S'3$ | $2S'4$ |
| $\sqrt{2}N'3$ | $\sqrt{2}N'4$ |

⇩

INVERSE
1D FT

⇩

SYNTHESIZED AND
AVERAGED
$D1(t) + D3(t)$

| $2S1$ | $2S2$ |
|---|---|
| $\sqrt{2}N1$ | $\sqrt{2}N2$ |
| $2S3$ | $2S4$ |
| $\sqrt{2}N3$ | $\sqrt{2}N4$ |

S/N IMPROVED $2/\sqrt{2}$

INCREASED SIGNAL-TO-NOISE RATIO IN MAGNETIC RESONANCE IMAGES USING SYNTHESIZED CONJUGATE SYMMETRIC DATA

This is a continuation of application Ser. No. 760,833 filed July 31, 1985, now abandoned.

This invention is related to the field of magnetic resonance imaging (MRI) utilizing nuclear magnetic resonance (NMR) phenomena. It is particularly related to novel signal processing techniques which provide an increased signal-to-noise ratio in the resulting magnetic resonance image.

This application is related to earlier filed, commonly assigned, patents of Crooks et al including U.S. Pat. Nos. 4,297,637; 4,318,043; 4,471,305; and 4,599,565. The contents of these referenced related patents is hereby incorporated by reference.

Magnetic resonance imaging (MRI) is now coming into widespread commercial usage. Nevertheless, there are still many possible areas of improvement. For example, desired improvements are still sought to reduce the time required to acquire NMR responses sufficient to define an NMR image and/or to improve the signal-to-noise ratio in such responses and in the resulting NMR image.

For static nuclei, the pixel values utilized to display an NMR image (e.g. as different shades of gray or color) are only real-valued. Even when the raw NMR RF signals are captured in complex-valued format (e.g. by using two RF receiving coils spatially disposed at 90° with respect to one another and thereby producing RF electrical response signals having an electrical phase difference of 90°) are utilized during data acquisition and Fourier transformation processes, it is only the absolute magnitude of the processed complex-valued variables which are utilized in a final NMR image plane.

Utilizing well known theorems applicable to Fourier transforms, it is known that if a function is phase invariant (i.e. that it can be described as a real-valued function), then its Fourier transform pair exhibits conjugate symmetry [i.e. $M^*(\phi) = M(-\phi)$].

As a direct result of this fact of conjugate symmetry, others have earlier proposed that one could reduce by one-half the amount of time required to acquire data sufficient to define an NMR image. That is, one need gather only one-half of the data used to construct an NMR image. The remaining needed half of the data set can be synthesized from the actually acquired data using the complex conjugate symmetry relationships which are assumed to exist for NMR phase invariant responses from static nuclei within an object (e.g. living or inanimate) to be imaged.

I have performed experiments which confirm the fact that the required data acquisition time can be cut in half as earlier proposed by others. However, in performing this experiment, I have discovered a further rather surprising fact. Namely, if one foregoes the possible savings in required data acquisition time (i.e. one proceeds to conventionally acquire a complete data set sufficient to determine a complete NMR image), one may nevertheless still utilize synthesized conjugate symmetric data during subsequent signal processing of the data so as to result in a significant signal-to-noise increase (e.g. up to a 100% or more increase). That is, one can trade the possible data acquisition time savings for increased signal-to-noise ratio.

This discovery occurred after I happened to note that the apparent signal-to-noise ratio in a conventional NMR image was substantially the same as the signal-to-noise ratio in the image using only half the actually measured data (with the remaining half data set being synthesized through the complex conjugate symmetry relationships). I had expected the signal-to-noise ratio of the image using a half synthesized data set to be materially less (e.g. $1/\sqrt{2}$) than the signal-to-noise ratio for the conventional NMR image (using a complete actually measured data set). I had expected this result because the synthesized data is not statistically independent from the actually measured data and, accordingly, since the resulting image is really based on only half as many measured data points (e.g. a single statistically independent data set of one-half the usual size) I expected the signal-to-noise ratio to be reduced when synthesized data was used.

In attempting to explain this apparent paradox, I came to the realization that each measured NMR response signal includes a random noise component which, unlike the desired NMR response signal itself, cannot be assumed to exhibit any complex conjugate symmetry. Thus, when the actually acquired half data set and the synthesized half data set are considered together, they will give rise to a pair of nonsymmetric noise sources which cumulatively increase the average noise only by about the same factor as would be expected if one were to proceed to actually acquire the complete data set.

In view of this analysis and discovery, I have further discovered that it is possible to derive synthesized conjugate symmetric data which can be averaged in such a way that the desired NMR signal responses add coherently while the undesired noise responses continue to combine in a random non-coherent fashion thereby increasing the relative signal-to-noise ratio in an averaged data set which utilizes synthesized data derived from assumed conjugate symmetric relationships between the desired signal components.

In brief overview, this invention contemplates foregoing the possible reduction in required data acquisition time and, instead, proceeding to conventionally acquire a complete first data set of complex-valued NMR signals (i.e. sufficient to determine an NMR image of an object e.g. typically a cross-sectional slice or "planar volume" through the object). A conventional set of orthogonal RF coils is typically utilized to obtain a pair of time domain signals with a 90° electrical phase shift therebetween. These signals are typically sampled at a fairly high rate with the sample point value of one of them becoming the real part and the other becoming the imaginary part of a complex-valued data sample point.

After the actually acquired complete data set is available (or at least after some of it becomes available), a second data set of synthesized NMR signals is derived therefrom based on assumed complex conjugate symmetry relationships. These symmetry relationships can be between desired NMR signal components in the time domain data and/or between the one-dimensional Fourier transforms of desired NMR signal components in a pseudo-time domain. Thereafter, the synthesized NMR signals and actually acquired data are combined into an averaged data set having an improved signal-to-noise ratio and a final NMR image is then conventionally derived from this averaged data set.

If only time domain data is synthesized and averaged, the signal-to-noise ratio may be improved by a factor of $2/\sqrt{2}$. Similarly, if one-dimensionally Fourier transformed data is synthesized and averaged in a pseudo-time domain, a similar signal-to-noise ratio improvement by a factor of $2/\sqrt{2}$ be realized. In this latter instance, the one-dimensionally transformed averaged data set may simply be further Fourier transformed in another dimension to produce the improved final NMR image. Alternatively, an inverse Fourier transformation can be performed so as to get the auto-averaged data set in the pseudo-time domain back into the time domain where it can be combined with other synthesized data sets obtained from conjugating about the second of the two dimensions. If both approaches are thus utilized together, one can obtain a signal-to-noise ratio which is improved by a factor of 4/2 (i.e. 100%) over that which is conventionally available using only the original acquired full data set to construct an NMR image.

These as well as other objects and advantages of this invention will be more completely understood by careful reading of the following detailed description of the presently preferred exemplary embodiments of this invention taken in conjunction with the accompanying drawings, of which:

Figure 3:
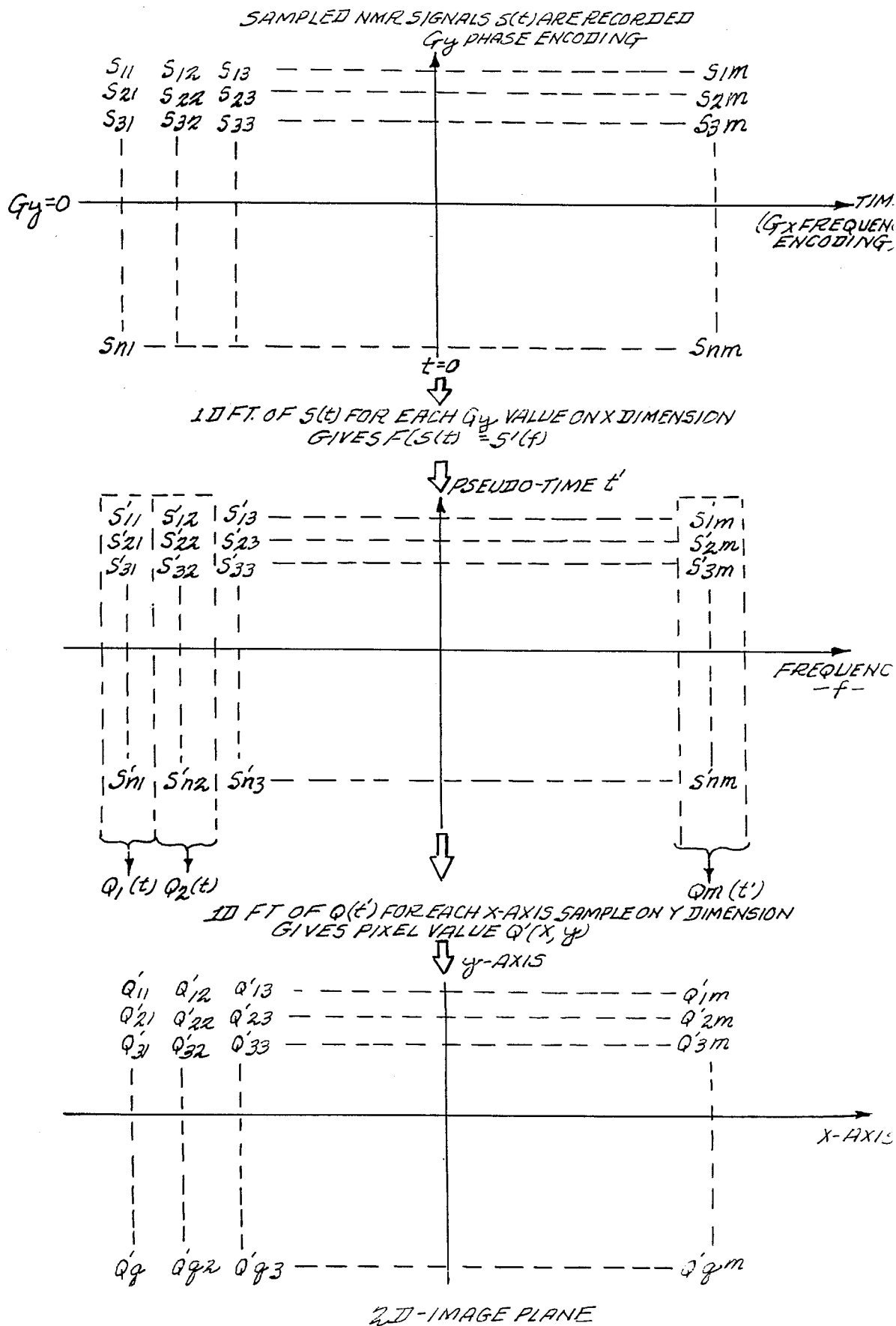
Figure 7:
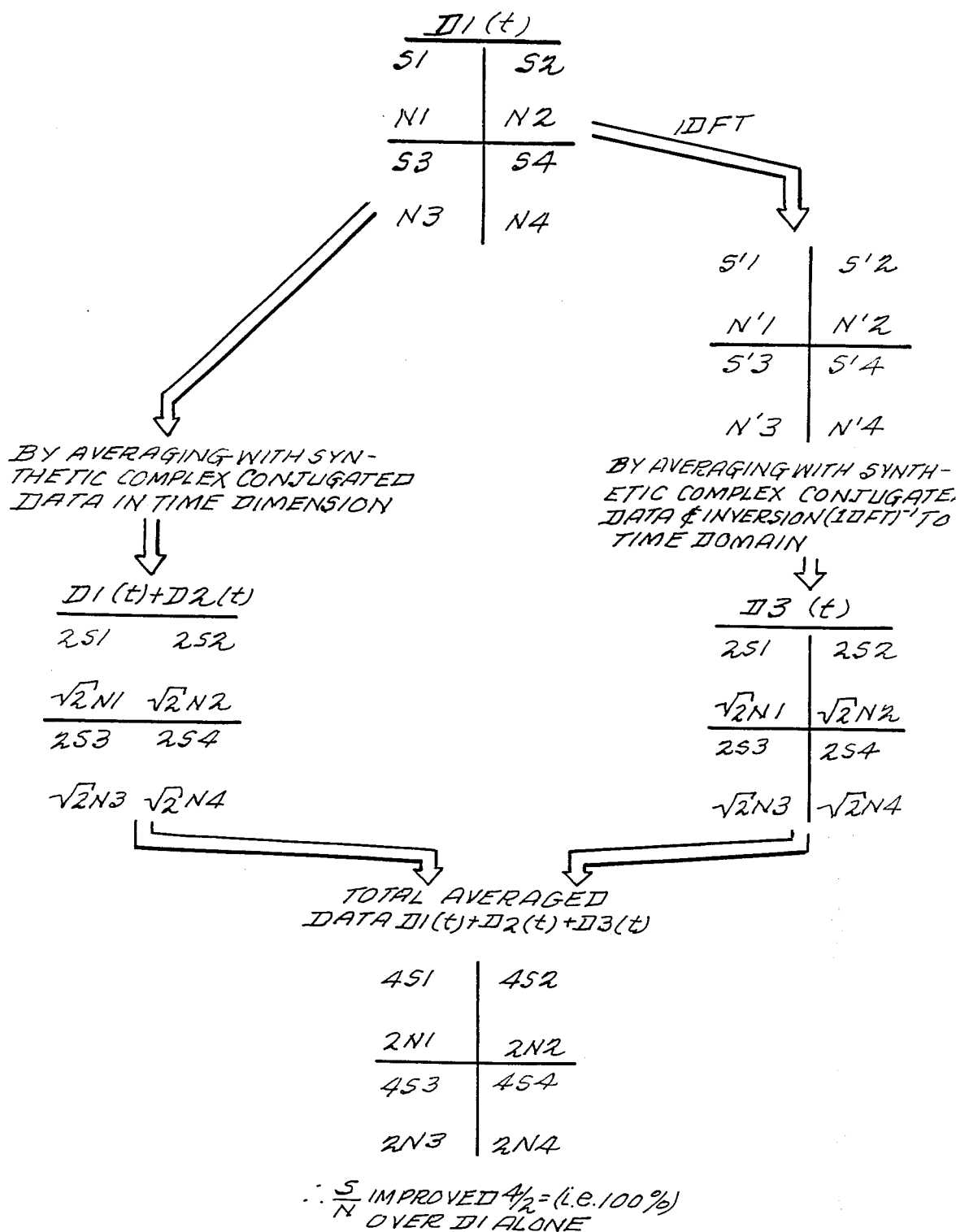
Figure 8:
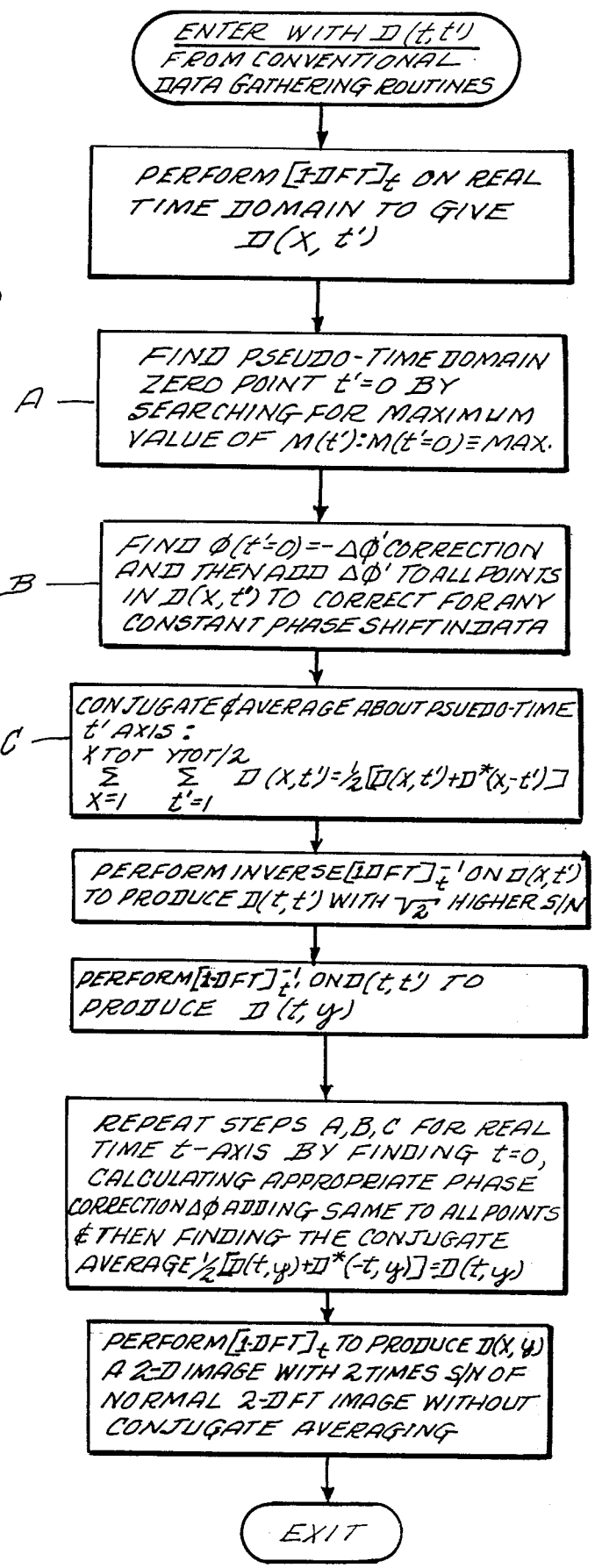

FIG. 3 schematically depicts a two-dimensional Fourier transformation signal processing utilized by Crooks et al to derive a two-dimensional NMR image from measured NMR RF response signals and which processes may also be used with preferred embodiments of this invention;

FIG. 4 is a simplified schematic depiction of an original NMR data set and a corresponding synthesized data set derived therefrom using conjugate symmetry relationships and also depicting a simplified quadrant nomenclature which is useful in other figures in explaining the present exemplary embodiment of this invention;

FIG. 5 depicts an exemplary signal processing procedure in accordance with this invention where synthesized data derived in the time domain using complex conjugate symmetry relationships is averaged with the actually acquired data set to produce a signal-to-noise improvement factor of $2/\sqrt{2}$;

FIG. 6 depicts another exemplary signal processing procedure in accordance with this invention where a synthesized data set is derived after a one-dimensional Fourier transformation in a pseudo-time domain using complex conjugate symmetry and averaged with the actually acquired data (also in the pseudo-time domain) so as to provide a signal-to-noise ratio improvement factor of $2/\sqrt{2}$;

FIG. 7 depicts another exemplary signal processing procedure in accordance with this invention which combines the procedures of FIGS. 5 and 6 so as to provide an overall signal-to-noise ratio improvement factor of 2 or 100%; and FIG. 8 is a flow chart depicting a suitable computer program for effecting a data processing procedure in accordance with an exemplary embodiment of this invention.

Figure 1:
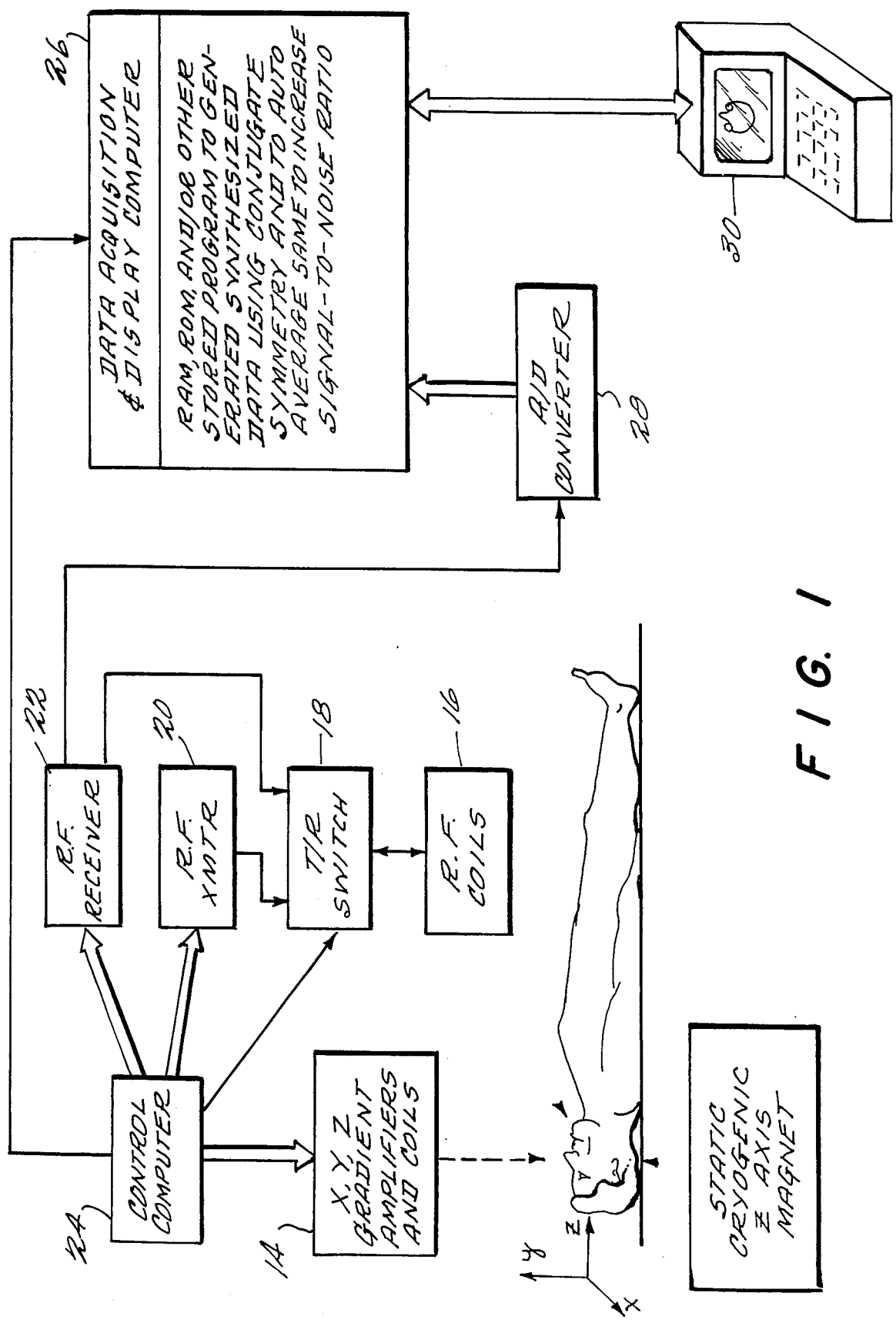
FIG. 1 is a block diagram of a typical MRI scanner system programmed so as to practice the novel signal processing procedure of this invention.

The novel signal processing procedure utilized by this invention can typically be achieved by suitable alteration of stored controlling computer programs in existing MRI apparatus. As one example of such typical apparatus, the block diagram of FIG. 1 depicts the general architecture of the Crooks et al system described in more detail in the above-referenced related patents and/or patent applications of Crooks et al.

Typically, a human or animal subject (or other object) 10 is inserted along the z-axis of a static cryogenic magnet which establishes a substantially uniform magnetic field directed along the z-axis within the portion of the object of interest. Gradients may be imposed within this z-axis directed magnetic field along the x, y or z axes by a set of x, y, z gradient amplifiers and coils 14. NMR RF signals are transmitted into the body 10 and NMR RF responses are received from the body 10 via RF coils 16 connected by a conventional transmit/receive switch 18 to an RF transmitter 20 and RF receiver 22. The RF coils 16 typically include a pair of orthogonal coils which produce a corresponding pair of RF signals having a relative 90° phase shift. The sampled magnitude of one (e.g. sin wt) is taken as the real part and the other (e.g. cos wt) as the imaginary part of a complex-valued actually acquired NMR data sample point.

All of the prior mentioned elements may be controlled, for example, by a control computer 24 which conventionally communicates with a data acquisition and display computer 26. The latter computer 26 may also receive NMR RF responses via an analog to digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure desired NMR RF responses in accordance with stored computer programs. As depicted in FIG. 1, the MRI system of this invention will typically include RAM, ROM and/or other stored program media adapted (in accordance with the following descriptions) so as to generate phase encoded spin echoes during each of multiple measurement cycles and to process the resulting MRI data into a final high resolution NMR image.

Figure 2:
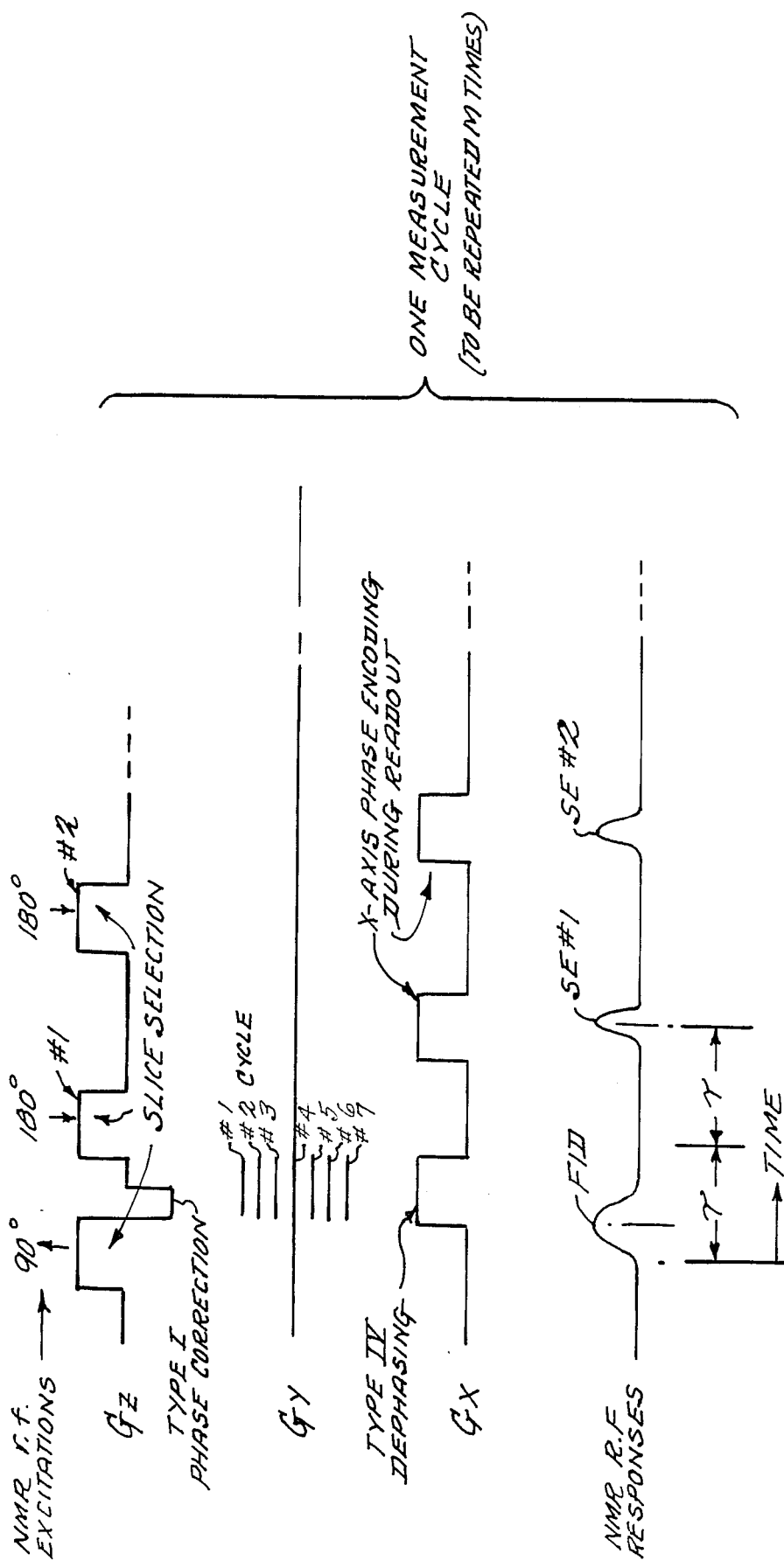
FIG. 2 is a schematic waveform diagram depicting a typical prior art Crooks et al data acquisition procedure which may be used in the presently preferred embodiment of this invention.

FIG. 2 depicts a typical prior art Crooks et al data acquisition sequence. For example, each measurement cycle may be initiated by a 90° NMR RF excitation followed by a 180° NMR RF nutation pulse located $\tau$ later in time and, if desired for signal averaging or other purposes, followed by subsequent 180° RF nutation pulses (typically distributed at $2\tau$ time intervals). It will be noted that during each RF excitation pulse there is a slice selection $G_z$ magnetic gradient pulse switched "on" so as to selectively excite only the desired "slice" or "planar volume" (e.g. a slice of given relatively small thickness through the object being imaged). During each resulting spin echo NMR RF response, x-axis phase encoding is achieved by applying an x-axis magnetic gradient during the readout procedure (typically each spin echo pulse is sampled every 30 microseconds or so with a digitized sample point data value being stored for later signal processing).

Although only seven measurement cycles are explicitly depicted in FIG. 2, it will be understood that, in practice, the number of measurement cycles typically is equal to the number of desired lines of resolution along the y-axis in the final image. Although a generalized case of plural spin echoes in a given measurement cycle is depicted at FIG. 2, if each spin echo signal has common y-axis phase encoding, typically only one or two spin echoes are utilized before that particular measurement cycle is terminated and the corresponding "slice" is allowed to "relax" for a T1 interval or more (sometimes called the time of relaxation TR) while other "slices" are similarly addressed so as to obtain their spin echo responses. Typically on the order of hundreds of such measurement cycles are utilized (e.g. so as to obtain enough data to provide hundreds of lines of resolution along the y-axis). A technique for more rapidly acquiring a complete NMR data set (by using incremental spin echo dependent Gy gradient pulses within a train of multiple spin echo responses in addition to cycle dependent Gy gradient pulses) is described in my co-pending commonly assigned application Ser. No. 760,832 filed July 31, 1985 (now allowed).

As may be better understood by reading the above referenced related patents/patent applications, a sequence of M such y-axis phase encoded spin echo signals may be subjected to a two-dimensional Fourier transformation process so as to result in M x M pixel values for a resulting NMR image.

The Fourier transformation of a digitally sampled waveform can be accomplished in accordance with well known signal processing functions. In the preferred exemplary embodiment, the well known "Fast Fourier Transform" (FFT) may be employed in a digital signal processing implementation of a type generally well known per se in the prior art. To briefly review one two-dimensional Fourier transformation process contemplated for this exemplary embodiment, the following analysis is given:

Let: $S_n(t)$ = the spin echo signal for each different Y-axis gradient Gyn (n=1, 2, ... n). Typically each $S_n(t)$ will be a discretely sampled complex-valued variable having m sample points $S_{n\bar{1}}$ $S_{nm}$. The topmost grid in FIG. 3 depicts an array of such m sample points in the time domain for each of n values of Gy.

Then let the one-dimensionally Fourier transformed spin echo signal be $$F(S_n) = S'_{n1} + S'_{n2} + S'_{n3} + \ldots S'_{nm} \quad \text{(Equation 1)}$$

where $S'_{nm}$ = the sinusoidal signal component (which may still at this point be complex valued if desired) at frequency $f_m$, the amplitude of which, in turn, represents the magnitude of a projected vertical column of spin densities with phase encoding Gyn corresponding to a particular vertical level within that column at a location along the X-axis represented by $f_m$ *(due to the X-axis phase-encoding during readout of the spin echo signal)*.

Thus an array of such one-dimensional spin density projections is formed, with each line in the array having different vertical level (Y-axis) phase encoding as is explicitly depicted in the middle grid of FIG. 3.

Now it may be observed that the values of the array members in any vertical column of the S' array can be treated like samples of a vertical line-volume spin echo read out with Y-axis phase encoding therealong in a "pseudo-time" t' domain. Thus, by performing a second dimension of Fourier transformation on this derived sampled waveform (i.e. along the discretely sampled waveform defined by each vertical array column in this pseudo-time domain), pixel values representing nutated nuclear density may be derived for each point volume in the planar volume from which the spin echo signals came. That is, if the derived phase-encoded waveforms in the vertical dimension are denoted by $Q_m(t')$ where m is the array column number, then $Q_m$ is represented by the sample values:

$$Q_m = S'_{1m}, S'_{2m}, S'_{3m} \ldots S'_{nm} \quad \text{(Equation 2)}$$

and its Fourier transform $$F(Q_m) = Q'_{1m} + Q'_{2m} + Q'_{3m} + \ldots Q'_{qm} \quad \text{(Equation 3)}$$

where $Q'_{qm}$ = the sinusoidal signal component at frequency $f_q$, the amplitude of which, in turn, represents the magnitude of spin density in a local point volume spatially located within the planar volume at an X-axis position corresponding to $f_m$ and a Y-axis position corresponding to $f_q$.

The result is an array of real-valued digital pixel data signals (i.e. the absolute value or magnitude of each complex-valued Q'), each representing the spatial spin density at a corresponding elemental "point" volume within the selected planar volume. These can be stored and used conventionally to drive a video image display on a CRT. For example, such an array of pixel data signals is depicted in the lowermost grid of FIG. 3 where the subscript m corresponds to frequencies $f_m$ representing X-axis pixel locations and the subscript q corresponds to frequencies $f_q$ representing Y-axis pixel locations as explained above. (Similarly, phase encoding on two independent axes and magnetic gradient modulation of the NMR signal during the readout period yields a data set with three dimensions of linearly encoded spatial information which, after three-dimensional Fourier transformation, produces three-dimensional images of x, y, z volumes.)

Magnetic resonance imaging (MRI) has been accomplished with several different pulse sequences including spin echo (see above Crooks et al techinques), spin warp, and echo planar techniques. In common to all of these imaging methods is the use of variable strength gradient pulses to spatially locate the different signals contributing to the net NMR signal and thus to make an image of two- or three-dimensional spatial distributions of NMR signal. In most commercial MRI systems, the signal is received by conventional quadrature detection techniques to measure a time variant NMR signal in-phase and 90° out-of-phase therewith. The magnitude of sample points taken from the two resulting signals become the real and imaginary components respectively of a complex-valued data set which is typically Fourier transformed (e.g. as explained above) to reconstruct an image. Presented here is a method of data acquisition, signal processing and image reconstruction based upon symmetry relationships in the phase encoded signals. The set of different phase encoded signals are averaged with synthesized conjugate symmetric signals to raise the signal to noise ratio by as much as 100% in the image.

In the above Crooks et al method of imaging, the phase of the magnetization vector M($\phi$) spans from n$\phi \rightarrow -$n$\phi$ to include all frequencies symmetrically distributed about $\phi = 0$ for the Fourier transformation process. However, $\rho(x,y)$ (i.e. the actual NMR spin density image pixel value $|Q'|$ at each x,y pixel location in the image plane) is phase invariant for static nuclei and can be described as a real-valued function, hence its Fourier transform pair M($\phi$) is conjugate symmetric: M*($\phi$) = M($-\phi$).

To test the conjugate symmetry relationship of phase encoded spin echoes, multi-section imaging was performed on a lucite plastic box filled with oil (Johnson and Johnson Baby Oil) in an actual laboratory experiment where field inhomogeneities or other factors could affect the linearity of the phase encoding process. Typically, the calculated $\rho(x,y)$ acquires additional phase factors so, in practice, the magnitude of $\rho(x,y)$ is presented as the hydrogen density function. The image of the oil phantom was reconstructed with one-half the data, $M(-\phi)$, being computer synthesized from $M^*(\phi)$. This "conjugate synthesized" image was compared and found to be visually similar to the image reconstructed using the entire acquired data set (i.e. the actually acquired $M(\phi)$ data plus the actually acquired $M(-\phi)$ data). Spatial resolution could be determined from the phantom's obliquely oriented internal lucite bars and was the same in both images.

A surprising observation in this experiment, confirmed in other separate image acquisitions, was that the signal-to-noise ratio S/N of the conjugate synthesized image was, within experimental error, equal to the S/N of the fully acquired image (requiring twice as much data acquisition time). The apparent paradox was that S/N should remain proportional to the square root of statiscally independent data sets, which $M(\phi)$ and $M^*(-\phi)$ were not, and consequently it was thought that the S/N of the conjugate synthesized image should be $1/\sqrt{2}$ less than the totally acquired image. The S/N measurements were made in two rectangular regions, on the oil signal (S) and on the surrounding air for measurement of background noise (N): (a) for the conjugate synthesized image $S=6088\pm183$ standard deviation SD, $N=30\pm21$ SD, $S/N=203$ and (b) for the image using only acquired data, $S=6672\pm141$ SD, $N=32\pm17$ SD, $S/N=208$. The standard deviations (SD) of noise were independently tested in an image of noise only, acquired without RF pulses to eliminate the signal: for the conjugate synthesized data image $SD=73$, for the totally acquired data image $SD=56$.

As just noted, experimental results have shown the S/N ratio for the image derived using only one-half the usually acquired data set (plus a one-half synthesized data set) to be the same as that for an image derived from only totally acquired data. Thus one may save one-half the data acquisition time by using conjugate symmetric synthesized data for one-half the data set required to construct the final NMR image. As previously noted, this possibility was known before and suggested by others. It is not known whether they also realized that use of such synthesized data would not adversely affect the resulting signal-to-noise ratio because this now discussed observation appears, at first blush, to be contrary to one's natural expectations (for reasons noted above).

In any event, having made the experimental observation of equivalent signal-to-noise ratios, I have now further discovered that if one uses a complete acquired data set (i.e. one foregoes the possible savings in required data acquisition time), then it is possible to process the acquired data in a way which increases the signal-to-noise ratio by as much as 100% in a 2DFT image and by $\sqrt{2}$ (well over 100%) in a 3DFT image.

One possible explanation for the observed experimental results is to assume that the acquired time domain data includes shot noise $n(\phi)$, modeled as a random distribution of dirac delta functions $\delta(t-t_o)$. Then, due to linearity considerations, the conjugate of $M(\phi)+n(\phi)$ is $M(-\phi)+n^*(\phi)$ where $n(-\phi)\neq n^*(\phi)$ since the noise component is not complex conjugate symmetric. Hence, by computer synthesis and use of the $M(-\phi)$ half data set during the experiment, the image noise distribution is determined by pairs of noise spots symmetrically positioned about $\phi=0$, which transform to $2A\cos(y)$. The noise distribution of a pair of unsymmetric noise spots $Ae^{-jy_1}+Ae^{-jy_2}$ is also obtained when a complete totally acquired data set is used. Thus, the average noise is also increased by $\sqrt{2}$ in the conjugate synthesized image in a manner similar to that involved in acquiring and using twice as much data. As described above, the two noise distributions are different as confirmed by their different standard deviations. (This method of conjugate synthesis for data might be extended to 3-D Fourier imaging methods involving recurrent phase-encoding on two axes for a 75% reduction in imaging time.)

I now propose new signal processing techniques which also take advantage of assumed conjugate symmetry but which permit one to trade the possible savings in data acquisition time for improvement in the signal-to-noise ratio of the resulting NMR image.

My novel method of auto-averaging for raising the signal-to-noise ratio in NMR images can be explained by Fourier analysis relationships. The NMR image is, in reality, a distribution of signals at unique frequencies which correspond to spatial position and thus the image may arbitrarily be called s(f) where f is the spatial frequency in the image. The inverse Fourier transform of this image is the time dependent NMR signal S(t). In fact, the acquired data set D(t) is a linear addition of the desired signal S(t) and random noise N(t) produced by statistical variation in induced eddy currents as well as electronic noise in the receiver and detector system.

$$D(t)=S(t)+N(t) \qquad \text{(Equation 4)}$$

The image s(f) of stationary nuclei is invariant of phase information in the image space and is made by displaying the magnitude of the complex-valued s(f). Thus the image is a real-valued valued function, except for possible errors due to static magnetic field inhomogeneities, and the signal S(t) is symmetrically positioned in time as well as in a signal readout period. Given s(f) is real-valued, then S(t) is complex conjugate symmetric: S(t) equals $S^*(-t)$. This relationship is not strictly true in the signal readout time (x-axis of a spin echo signal) due to the T2 relaxation which occurs during time of NMR spin echo signal formation. The complex conjugate symmetry, however, is nearly exact for signals which have characteristic T2 decay which is several times longer than the signal formation period, as determined by the signal readout gradient, Gx. It may also be realized by correcting for such T2 decay (see, for example, my copending commonly assigned application noted above).

S(t) is also complex conjugate symmetric in the "pseudo-time" t′ dimension of Gy linear phase encoding of multiple cycles. FIG. 4 shows a representative data set D1 with x-axis time domain information represented horizionally and y-axis pseudo-time domain phase encoded information represented vertically. Both negative and positive Gy-gradient pulses were used, with zero Gy-gradient positioned in the center of the vertical axis of the data set. Small gradient pulses are typically applied (G′y and G′x) to adjust the position of the data so as to be symmetrically centered in time (x-axis) and pseudo-time (y-axis). A second data set D2 is then synthetically created from the original data set D1 by taking the complex conjugate of each row in D1 (FIG. 4) and moving this new data to a corresponding negative position:

$$D2(t) = S^*(-t) + N^*(-t) \quad \text{(Equation 5)}$$

The noise component N(t) does not have complex conjugate symmetry and so although $$S(-t) = S^*(t), \quad \text{(Equation 6)}$$

$$N(-t), N^*(t) \quad \text{(Equation 7)}$$

The new synthetic data set D2 is therefore, produced by reflecting the complex conjugate of the original data set D1 about a central axis (t=0), and by substitution of S(t) for S*(−t). Adding the original data set with the synthesized data gives coherent addition of the desired signals. However the noise N adds incoherently and therefore increases by only $\sqrt{2}$:

$$D1 + D2 = 2S(t) + \sqrt{2}\, N(t). \quad \text{(Equation 8)}$$

Consequently, this "auto-averaging" of the NMR data with the synthesized data produces a $2\sqrt{2}$ higher signal-to-noise relationship in the resulting data set, and, after Fourier transformation, a $2\sqrt{2}$ S/N increase in the final NMR image.

The auto-averaging procedure is diagrammatically shown in FIGS. 5 and 6 for a two-dimensional dimensional data set by reflection of data about both the x-axis and y-axis to produce four independent sets of data. The averaging of these four sets of data gives two times the S/N ratio obtained by using conventional techniques. Here the signal in each quadrant of the two-dimensional data set is denoted by S1, S2, S3, S4 and the repetitive noise is N1, N2, N3, N4. The four data sets are independent since N1≠N2*≠N3*≠N4** (where * denotes the act of taking the complex conjugate and reflection about an axis, and ** denotes the similar act of reflecting about two axes). The desired object signals in each quadrant do, however, add coherently because S1=S2*=S3*=S4**. Thus, the auto-averaging of data in each quadrant gives 4S/$\sqrt{4N}$=2 S/N compared to using the single completely acquired data set in a conventional process.

In a three-dimensional data set produced with an additional linearly independent phase encoding gradient similar auto-averaging may be applied in this third dimension to yield an additional $\sqrt{2}$ S/N increase.

In practice T2 decay of the signal during readout tends to remove the assumed conjugate symmetry of the spin echo signal. This T2 decay problem, however, does not affect the pseudo-time t' domain variation of signal phase by linear phase encoding gradients (e.g. along the y-axis). Thus even if the T2 decay creates significant non-symmetry for some situations, a $2/\sqrt{2}$ S/N improvement can still be obtained in the t' domain. (And my related copending application also provides a way to correct for T2 decay if spin echo dependent Gy pulses are utilized.)

It has been found in initial experiments that the distribution of noise in the auto-averaged image has increased variance and a decreased average. This can be explained by modeling the individual noise spot in the time domain as a delta function as previously mentioned. Its reflection about an axis and the addition gives two delta functions symmetric about the axis and their Fourier transform gives a Zcos (f) function compared to an individual delta function for each independently transformed noise spot. The averaging of this noise function with the other noise spots is not coherent, thus, it is possible for noise spots to have greater magnitude. Some actual experiments showed decreased mean noise but with a few noise spots having intensities greater than those found in the "original" image.

A simplified 4×4 array original data set D1 is depicted at the top of FIG. 4. To help visualize the conjugate symmetry relationships and the derivation of synthesized data based upon such relationships, it is useful to note the relationship of the four quadrants of such an array as depicted in the upper right-hand portion of FIG. 4. Using conjugate symmetry, a synthesized data set D2 is formed in the lower portion of FIG. 4. Once again, a corresponding quadrant depiction is shown on the right-hand side of FIG. 4. As will be observed by comparing the quadrant depictions at the top and bottom of FIG. 4, the data set has merely been transposed about the vertical y axis and complex conjugate values have been substituted as well.

Of course, in actuality, in addition to the desired signal S components, there are also noise components N. Thus, using the simplified quadrant depiction introduced at FIG. 4, the topmost portion of FIG. 5 represents an actual acquired full data set D1. That is, data set D1 represents complex-valued NMR signals (including unavoidable noise components) sufficient to determine a complete NMR image of an object. FIG. 5 next depicts a synthetic data set D2 obtained using complex conjugate symmetry in the time domain t. When data sets D1 and D2 are added together, the result is coherent addition of the desired signal (as depicted in FIG. 5) but incoherent random addition of the undesirable noise components (as also depicted in FIG. 5). The resulting averaged D1+D2 data set thus exhibits a signal-to-noise ratio which is improved by a factor of $2\sqrt{2}$ over that present in the actually acquired full data set D1. A similar improvement in signal-to-noise ratio will occur in the resulting NMR image calculated by two-dimensional Fourier transform techniques (see FIG. 3) as will be appreciated by those in the art.

A similar improvement may be obtained in the pseudo-time dimension t' as depicted in FIG. 6. Here, the same actually acquired full data set D1 in the time domain is transformed by a one-dimensional Fourier transform (as in the middle portion of FIG. 3) to a corresponding fully acquired data set D'1 after a one-dimensional Fourier transform. Here, in the pseudo-time dimension, similar complex conjugate symmetry exists in a vertical sense (as opposed to the horizontal sense in the real-time domain of FIG. 5). Therefore, by using such complex conjugate symmetry and transposing the actually acquired data set D'1 in a vertical sense (i.e. around the horizontal axis). One can construct a synthetic data set D'3 using complex conjugate symmetry in the pseudo-time domain t'. When D'1+D'2 are added, one achieves a similar $2\sqrt{2}$ in the signal-to-noise ratio as also depicted in FIG. 6. Since one-dimensional Fourier transformation is already effected at this point, one might, if desired, proceed with the final dimension of Fourier transformation (see the lower part of FIG. 3) to produce a final NMR image using only the auto-averaged D'1+D'3 data set. Alternatively, one may take the auto-averaged data set from the pseudo-time dimension t' and perform inverse one-dimensional Fourier transformation so as to get back to the real-time domain t with a corresponding auto-averaged time domain data set having a similar $2\sqrt{2}$ improvement in signal-to-noise ratio as is also depicted in FIG. 6. Or, one might transform the auto-averaged time domain data to the pseudo-time domain for further auto-averaging.

If the processes of FIGS. 5 and 6 are combined, then an overall signal-to-noise ratio of 100% improvement may be obtained as depicted in FIG. 7. Here, the auto-averaged time domain data derivation is depicted on the left side of FIG. 7 (corresponding to FIG. 5) while the auto-averaged data set derived in the pseudo-time dimension is depicted on the right-hand side of FIG. 7 (as per FIG. 6). The two resulting auto-averaged data sets may then be combined in the time domain to provide an overall signal-to-noise improvement of 100% as depicted in FIG. 7. As should be appreciated, the resulting total auto-averaged data set shown at the lower part of FIG. 7 would then be utilized in a two-dimensional Fourier transformation process (see FIG. 3) to produce a final NMR image having similar improvement in signal-to-noise ratio.

Those skilled in the art should now be able to readily design suitably modified MRI computer programs for effecting the above described signal processing procedures. One such program is schematically depicted in the flow chart of FIG. 8. Here the conventionally acquired data $D(t,t')$ is assumed to have been maintained in complex-valued format $D=R+jI$ and where the magnitude $M=[I^2+R^2]^{\frac{1}{2}}$ and where the phase $\phi=\tan^{-1}(I/R)$. In view of the foregoing discussion, the flow chart of FIG. 8 should be self-explanatory.

Although only a few exemplary embodiments of this invention have been described in detail, those skilled in the art will appreciate that many modifications and variations may be made in these exemplary embodiments while still retaining many of the novel advantages and features of this invention. Accordingly, all such modifications and variations are intended to be included within the scope of the appended claims.

What is claimed is:

1. A method for magnetic resonance imaging of an object, said method comprising the steps of:
   (a) acquiring a first data set of complex-valued NMR signals sufficient to determine an NMR image of said object;
   (b) deriving from said first data set a second data set of artificial NMR signals based on complex conjugate symmetry relationships between the NMR signal components contained in said first data set;
   (c) adding together corresponding signals of said first and second data sets to produce an averaged data set; and
   (d) producing an NMR image using said averaged data set.

2. A method as in claim 1 further comprising the step of:
   deriving from said first data set a third data set of artificial NMR signals based on complex conjugate symmetry between the Fourier transforms of the NMR signal components contained in said first data set, and wherein
   said adding step includes adding together corresponding signals of said third data set with said first and second data sets to produce said averaged data set.

3. A method for magnetic resonance imaging of an object, said method comprising the steps of:
   (a) acquiring a first data set of complex-valued NMR signals sufficient to determined an NMR image of said object;
   (b) deriving from said first data set a second data set of artificial NMR signals based on complex conjugate symmetry relationships between the Fourier transforms of the NMR signal components contained in said first data set;
   (c) adding together corresponding signals of said first and second data sets to produce an averaged data set; and
   (d) producing an NMR image using said averaged data set.

4. A method for magnetic resonance imaging, said method comprising the steps of:
   (a) actually acquiring first NMR responses;
   (b) artificially generating second NMR responses from said first NMR responses using assumed complexes conjugate symmetry relationships;
   (c) averaging together said first and second NMR responses; and
   (d) producing an NMR image using said averaged NMR responses.

5. A method for magnetic resonance imaging, said method comprising the steps of:
   (a) acquiring auto-averaged artificial NMR response signals using complex conjugate symmetry of actually acquired NMR responses; and
   (b) producing an NMR image using said auto-averaged artificial NMR response signals.

6. Apparatus for magnetic resonance imaging of an object, said method comprising:
   (a) means for acquiring a first data set of complex-valued NMR signals sufficient to determine an NMR image of said object;
   (b) means for deriving from said first data set a second data set of aritificial NMR signals based on complex conjugate symmetry relationships between the NMR signal components contained in said first data set;
   (c) means for adding together corresponding signals of said first and second data sets to produce an averaged data set; and
   (d) means for producing an NMR image using said averaged data set.

7. Apparatus as in claim 1 further comprising:
   means for deriving from said first data set a third data set of artificial NMR signals based on complex conjugate symmetry between the Fourier transforms of the NMR signal components contained in said first data set, and wherein
   said adding step includes adding together corresponding signals of said third data set with said first and second data sets to produce said averaged data set.

8. Apparatus for magnetic resonance imaging of an object, said method comprising:
   (a) means for acquiring a first data set of complex-valued NMR signals sufficient to determine an NMR image of said object;
   (b) means for derving from said first data set a second data set of artificial NMR signals based on complex conjugate symmetry relationships between the Fourier transforms of the NMR signal components contained in said first data set;

(c) means for adding together corresponding signals of said first and second data sets to produce an averaged data set; and (d) means for producing an NMR image using said averaged data set.

9. Apparatus for magnetic resonance imaging, said method comprising:

(a) means for acutally acquiring first NMR responses;

(b) means for artificially generating second NMR responses from said first NMR responses using assumed complex conjugate symmetry relationships;

(c) means for averaging together said first and second NMR responses; and (d) means for producing an NMR image using said averaged NMR responses.

10. Apparatus for magnetic resonance imaging, said method comprising:

(a) means for acquiring auto-averaged artificial NMR response signals using complex conjugate symmetry of actually acquired NMR responses; and (b) means for producing an NMR image using said auto-averaged artificial NMR response signals.

* * * * *

UNITED STATES PATENT AND TRADEMARK OFFICE
CERTIFICATE OF CORRECTION

PATENT NO. : 4,728,893
DATED : 1 March 1988
INVENTOR(S) : FEINBERT, David A.

It is certified that error appears in the above-identified patent and that said Letters Patent is hereby corrected as shown below: On The Title Page:

IN THE TITLE:

Change the title to read: "MAGNETIC RESONANCE IMAGING USING SYNTHESIZED CONJUGATE SYMMETRIC DATA"

IN THE ABSTRACT:

Lines 9-18, change "to result...it may be" to --and--.

Lines 21-22, delete "having a similarly improved signal-to-noise ratio".

Signed and Sealed this

Eighth Day of November, 1988

Attest:

DONALD J. QUIGG

Attesting Officer

Commissioner of Patents and Trademarks